(12) United States Patent
Cho

(10) Patent No.: US 7,700,149 B2
(45) Date of Patent: *Apr. 20, 2010

(54) METHOD AND APPARATUS FOR PROVIDING A DEPOSITION IN VACUUM FOR LAMINATING A CIRCUIT BOARD

(75) Inventor: Jeong Cho, Yongin (KR)

(73) Assignee: Toray Saehan Inc., Gumi (KR)

( * ) Notice: Subject to any disclaimer, the term of this patent is extended or adjusted under 35 U.S.C. 154(b) by 666 days.

This patent is subject to a terminal disclaimer.

(21) Appl. No.: 11/194,499

(22) Filed: Aug. 1, 2005

(65) Prior Publication Data

US 2006/0024428 A1 Feb. 2, 2006

(30) Foreign Application Priority Data

Aug. 2, 2004 (KR) .................. 10-2004-0060889

(51) Int. Cl.
*B05D 5/12* (2006.01)
(52) U.S. Cl. .................. 427/97.1; 427/97.6; 427/98.6; 427/432
(58) Field of Classification Search ................ 427/96.1, 427/96.8, 97.1, 97.6, 98.6, 532, 585; 204/192.1
See application file for complete search history.

(56) References Cited

U.S. PATENT DOCUMENTS

| | | | | |
|---|---|---|---|---|
| 5,218,030 | A * | 6/1993 | Katayose et al. | 524/371 |
| 5,729,896 | A * | 3/1998 | Dalal et al. | 29/840 |
| 6,284,329 | B1 * | 9/2001 | Matienzo et al. | 427/537 |
| 6,358,619 | B1 * | 3/2002 | Sueoka et al. | 428/474.4 |
| 6,620,513 | B2 * | 9/2003 | Yuyama et al. | 428/416 |
| 7,281,328 | B2 * | 10/2007 | Lee et al. | 29/852 |
| 7,282,255 | B2 * | 10/2007 | Hiranaka et al. | 428/209 |
| 7,371,499 | B2 * | 5/2008 | Noh et al. | 430/191 |
| 7,507,434 | B2 * | 3/2009 | Cho et al. | 427/96.1 |
| 2003/0059541 | A1 * | 3/2003 | Ogure | 427/383.1 |
| 2004/0040148 | A1 * | 3/2004 | DeMaso et al. | 29/852 |
| 2005/0202305 | A1 * | 9/2005 | Markoski et al. | 429/38 |
| 2005/0238896 | A1 * | 10/2005 | Itoh et al. | 428/473.5 |
| 2006/0024428 | A1 * | 2/2006 | Cho | 427/96.1 |
| 2006/0024449 | A1 * | 2/2006 | Cho et al. | 427/532 |
| 2008/0283278 | A1 * | 11/2008 | Wang et al. | 174/254 |

FOREIGN PATENT DOCUMENTS

| | | | |
|---|---|---|---|
| WO | WO 03/105545 | * | 12/2003 |
| WO | WO 2004/050352 | * | 6/2004 |
| WO | WO 2006/110364 | * | 10/2006 |

OTHER PUBLICATIONS

Takashi, Natsume, et al., "Latest technology trend of printed circuit board and semiconductor package substrate ..." Electronic Parts and Materials, vol. 43, No. 10, pp. 20-24 (2004) Japan. Abstract Only.*

* cited by examiner

*Primary Examiner*—Bret Chen
(74) *Attorney, Agent, or Firm*—Revolution IP, PLLC

(57) ABSTRACT

An approach is provided for depositing a material onto a printed circuit board layer. The approach includes steps of treating surface of a base film, forming a tie layer on the base film, forming a metal conductive layer on the tie layer, and depositing a metal on the metal conductive layer by radiating electronic beams to form a metal plated layer thereon. The above steps are continuously performed in a vacuum chamber. The approach also includes an unwinding roller, film guide rollers, a surface treating part, tie layer and copper conductive layer, a vacuum depositing part for depositing a metal plated layer on the metal conductive layer by radiating electronic beams, and a winding roller, all of which are provided in a vacuum chamber.

5 Claims, 2 Drawing Sheets

[Fig. 1]
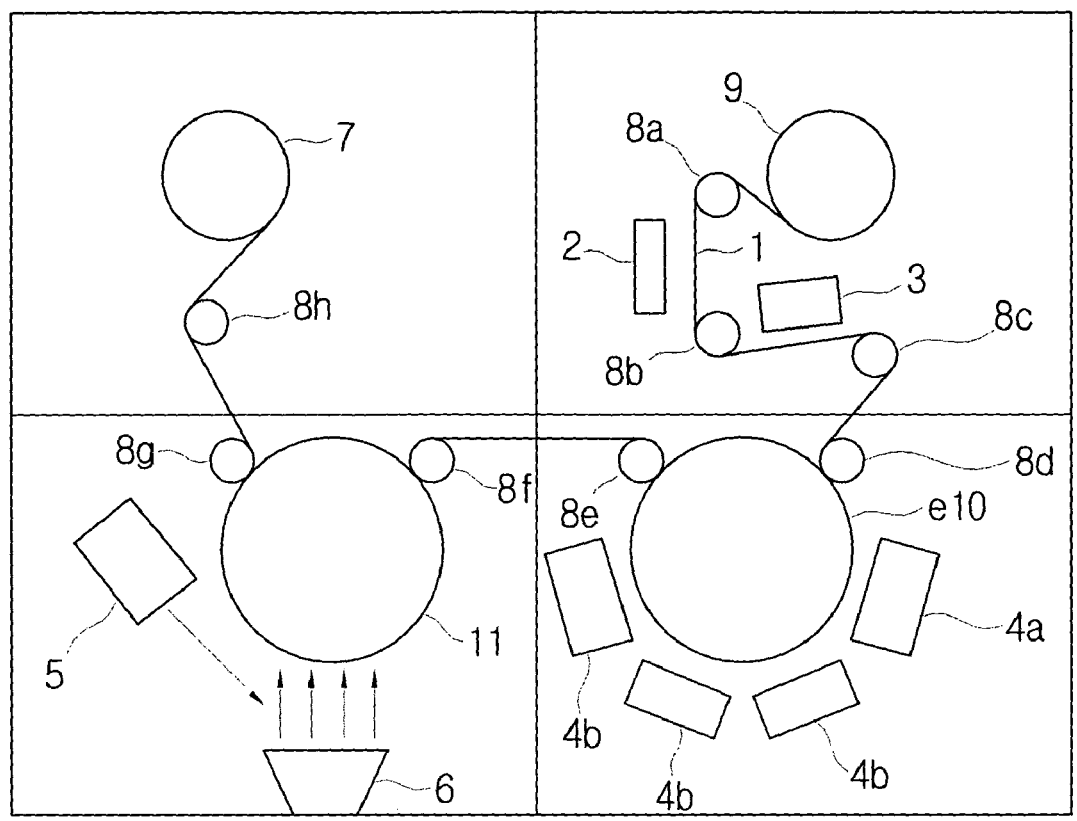

[Fig. 2] Background
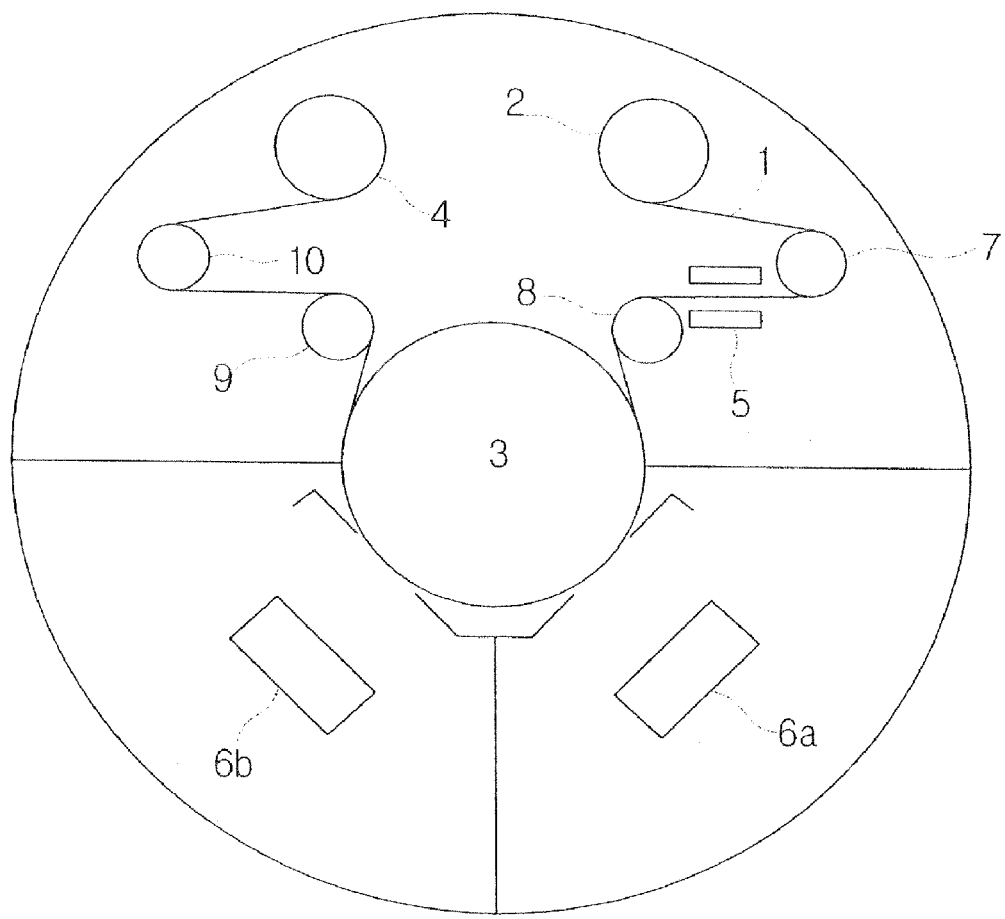

METHOD AND APPARATUS FOR PROVIDING A DEPOSITION IN VACUUM FOR LAMINATING A CIRCUIT BOARD

BACKGROUND OF THE INVENTION

1. Field of the Invention

The present invention relates generally to a method and apparatus for manufacturing a laminate for a flexible printed circuit board (FPCB), and, more particularly, to a method and apparatus for forming a metal plated layer in manufacturing a laminate for an FPCB.

2. Description of the Related Art

With reference to FIG. 2, a conventional method of manufacturing a laminate for an FPCB is described. FIG. 2 is a view showing a conventional apparatus for manufacturing a laminate for an FPCB.

The conventional apparatus for manufacturing a laminate for an FPCB comprises a transferring system including an unwinding roller 2, a main drum 3 and a winding roller 4, all of which are provided in a vacuum chamber. In addition, an infrared heater 5 for pre-heating a polyimide film 1 and film guide rollers 7, 8, 9 and 10 are provided. In addition, a tie layer sputtering cathode 6a and a copper conductive layer sputtering cathode 6b are provided, so that a tie layer and a copper conductive layer are sequentially formed when the polyimide film 1 is in contact with the main drum 3.

In the manufacturing method using the apparatus for manufacturing a laminate for an FPCB, the polyimide film 1 is unwound from the unwinding roller 2 at a predetermined unwinding tension. Then, the polyimide film 1 is heated using the infrared heater 5 between the film guide rollers 7 and 8. The heated polyimide film 1 is guided around the roller 8. While the polyimide film 1 is in contact with the main drum 3, the tie layer is first formed on the polyimide film 1 using the tie layer sputtering cathode 6a, after which the copper conductive layer is formed on the tie layer by the copper conductive layer sputtering cathode 6b. Thereafter, the polyimide film 1 having the copper conductive layer formed thereon is guided around the rollers 9 and 10 and then wound on the winding roller 4 at a predetermined winding tension.

Subsequently, the polyimide film processed in the vacuum chamber is exposed to external air and undergoes a process of forming a copper plated layer by wet plating using an aqueous copper sulfate solution, which is not shown in the drawing.

However, the conventional method of manufacturing a laminate for an FPCB has the following problems. That is, since the polyimide film is exposed to external air to form the copper plated layer thereon, the polyimide film having the copper conductive layer thereon may be easily oxidized by external air, which negatively affects the subsequent processes. In addition, the polyimide film having the copper conductive layer thereon may be contaminated by dust present in the external air.

Further, when the copper plated layer is formed by a wet plating process, a chemical such as an aqueous copper sulfate solution for wet plating is used, resulting in environmental contamination.

SUMMARY OF THE INVENTION

Accordingly, the present invention has been made keeping in mind the above problems occurring in the prior art, and an object of the present invention is to provide a method and apparatus for manufacturing a laminate for an FPCB, which can form a metal plated layer without oxidation of a polyimide film having a metal conductive layer thereon by external air or contamination of the film by dust present in external air.

Another object of the present invention is to provide a method and apparatus for manufacturing a laminate for an FPCB, which can prevent environmental contamination caused by a chemical used in a conventional wet plating process.

A further object of the present invention is to provide a method and apparatus for manufacturing a laminate for an FPCB that has excellent properties, such as number of pinholes, average particle size, adhesive strength and tensile strength, which greatly improve the reliability of the FPCB.

In order to accomplish the above objects, the present invention provides a method of manufacturing a laminate for an FPCB, comprising surface treating a base film, forming a tie layer on the base film, forming a metal conductive layer on the tie layer, and depositing a metal on the metal conductive layer by radiating electronic beams to form a metal plated layer thereon, all of which are conducted in a vacuum chamber.

In addition, the present invention provides an apparatus for manufacturing a laminate for an FPCB, comprising an unwinding roller for unwinding a base film therefrom, film guide rollers for guiding and transferring the base film, a surface treating part for surface treating the transferred base film, tie layer and copper conductive layer forming parts for sequentially forming a tie layer and a metal conductive layer on the surface treated base film, a vacuum depositing part for depositing a metal on the metal conductive layer by radiating electronic beams to form a metal plated layer thereon, and a winding roller for winding the base film having the metal plated layer formed thereon, all of which are provided in a vacuum chamber.

The vacuum depositing part may include a metal boat, an electron gun for radiating electronic beams onto the metal boat, and a main depositing drum for depositing a metal on the metal conductive layer by radiating electronic beams to form the metal plated layer thereon when the base film is in contact with the depositing drum.

Preferably, the main depositing drum may be provided with a cooling means. Thereby, the base film may be prevented from damage by heat generated upon vacuum deposition.

Preferably, the metal conductive layer and the metal plated layer may be formed of copper.

In addition, the base film may be preferably a polyimide film. Further, the tie layer and the metal conductive layer may be preferably formed by sputtering.

BRIEF DESCRIPTION OF THE DRAWINGS

The above and other objects, features and advantages of the present invention will be more clearly understood from the following detailed description taken in conjunction with the accompanying drawings, in which:

FIG. 1 is a view showing an apparatus for manufacturing a laminate for an FPCB, according to the present invention; and FIG. 2 is a view showing a conventional apparatus for manufacturing a laminate for an FPCB.

DESCRIPTION OF THE PREFERRED EMBODIMENTS

Hereinafter, a detailed description will be given of the resent invention, with reference to the appended drawings.

FIG. 1 is a view showing an apparatus for manufacturing a laminate for an FPCB, according to the present invention.

The apparatus for manufacturing a laminate for an FPCB comprises an unwinding roller 9 for unwinding a polyimide film 1 therefrom, an infrared heater 2 for pre-heating the unwound polyimide film 1, a surface treating part 3 for treating the surface of the heated polyimide film 1, film guide rollers 8a to 8h for transferring the polyimide film 1, a tie layer sputtering cathode 4a and copper conductive layer sputtering cathodes 4b for sequentially sputtering a tie layer and a copper conductive layer on the polyimide film 1 when the polyimide film 1 is in contact with a main sputtering drum 10, a copper boat 6 for receiving a copper ingot, an electron gun 5 for radiating electronic beams required for deposition onto the copper boat 6 to form a copper plated layer on the polyimide film 1 when in contact with a main depositing drum 11, and a winding roller 12 for winding the polyimide film 1 having the copper plated layer thereon, all of which are provided in a vacuum chamber.

The sputtering drum 10 and the depositing drum 11 for conducting sputtering and depositing, respectively, on the polyimide film 1 are each provided with a cooling means for preventing the polyimide film 1 from being damaged by heat generated in the corresponding processes.

In this way, all elements constituting the apparatus for manufacturing a laminate for an FPCB of the present invention are provided in the vacuum chamber.

Below, the operation of the apparatus for manufacturing a laminate for an FPCB of the present invention is specifically described.

The polyimide film 1 is unwound from the unwinding roller 9 at a predetermined tension. The unwound polyimide film 1 is heated by the infrared heater 2 between film guide rollers 8a and 8b, and then surface treated by the surface treating part 3. In the surface treatment, a process of treating the surface of a polyimide film using plasma may be included to increase the adhesive strength.

Subsequently, the polyimide film 1 is transferred to the main sputtering drum 10 through the roller 8c. When the polyimide film 1 is in contact with the sputtering drum 10, a tie layer is first formed by the tie layer sputtering cathode 4a, and then a copper conductive layer is formed on the tie layer by the copper conductive layer sputtering cathodes 4b. The sputtering process conducted in the present invention is known in the art, and thus, specific descriptions thereof are omitted.

Subsequently, the polyimide film 1 is transferred to the main depositing drum 11. The electron gun 5 radiates electronic beams onto the copper boat 6 to evaporate the copper. The copper component evaporated by the electronic beams is deposited on the copper conductive layer of the polyimide film 1 when the polyimide film 1 is in contact with the depositing drum 11. Thereby, a copper plated layer is formed through the above deposition.

The polyimide film 1 on which the copper plated layer is formed is wound on the winding roller 7.

As such, the sputtering process on the polyimide film 1 is conducted at 220-250° C., and the process of depositing copper by electronic beams to form a copper plated layer on the polyimide film 1 is conducted at a high temperature of 800-900° C. Hence, each of the sputtering drum 10 and the depositing drum 11 is provided with a cooling means as noted above, so that the polyimide film 1 is prevented from being damaged by generated heat.

As mentioned above, all elements constituting the apparatus for manufacturing a laminate for an FPCB of the present invention are provided in the vacuum chamber, and thus, all manufacturing processes are conducted in a vacuum. Conventionally, a polyimide film having a copper conductive layer formed thereon is not further processed in a vacuum chamber but is exposed to external air to form a copper plated layer using a wet plating process. However, in the present invention, a copper plated layer is formed on a polyimide film through a dry plating process using deposition in the vacuum chamber, instead of a conventional wet drying process.

Hence, the polyimide film having a copper conductive layer formed thereon is never oxidized by external air or contaminated by dust present in external air.

In addition, since an aqueous copper sulfate solution, which is a chemical for use in the formation of a copper plated layer in a conventional wet plating process, is not used in the present invention, environmental contamination caused by such a chemical can be prevented.

The properties of the copper plated layer formed by a conventional wet plating process and the copper plated layer formed by vacuum deposition of the present invention are measured. The results are given in Table 1 below.

TABLE 1

| Properties | Wet plating | Vacuum depositing |
|---|---|---|
| Maximum Thickness of Copper (μm/min) | 70 | 7 |
| Number of Pinholes (No./cm$^2$) | 15 | 1-2 |
| Average Particle Size (μm) | 2-3 | 0.1-0.3 |
| Initial Adhesive Strength (kgf/cm) | 0.65 | 0.8 |
| Tensile Strength of Copper (kgf/mm$^2$) | 38 | 65 |

As is apparent from Table 1, the maximum thickness of the copper plated layer formed per min is larger when using a conventional wet plating process than when using a vacuum depositing process of the present invention.

However, in addition to the above thickness, the copper plated layer of the present invention has properties superior to the copper plated layer formed by a conventional wet plating process.

That is, the copper plated layer formed by a conventional wet plating process has an average of 15 pinholes per cm$^2$, but the copper plated layer of the present invention has an average of 1-2 pinholes. As such, since the pinhole causes circuits to be defective upon the formation of a copper wire pattern, the FPCB manufactured by the present invention has lower circuit wiring defect rates.

In addition, although the copper plated layer formed by a conventional wet plating process has an average particle size of 2-3 μm, the copper plated layer of the present invention has an average particle size of 0.1-0.3 μm, corresponding to 1/10 of the conventional size. If the average particle size, that is, the size of crystal particles, of the copper plated layer is decreased, a crack propagation rate is lowered. Thereby, circuit defect rates related to many windings formed on the FPCB are decreased, hence increasing the reliability of the FPCB.

In addition, the copper plated layer of the present invention has initial adhesive strength between the polyimide film and the copper plated layer and tensile strength of the copper plated layer, greatly affecting the reliability of the FPCB, higher than the copper plated layer formed by a conventional wet plating process.

In this way, although the copper plated layer of the present invention has a slightly lower formation rate than a conventional wet plating process, it is superior in terms of the number of pinholes, the average particle size, the adhesive strength and tensile strength, all of which greatly affect the reliability of the PCB. Therefore, according to the present invention, a highly reliable FPCB can be manufactured.

Further, the base film is a polyimide film in the present invention, but is not limited thereto. Any material may be used as long as it may be used as a base film to manufacture a laminate for FPCBs.

In addition, the conductive layer and the plated layer are formed of copper, but are not limited thereto. Any material may be used as long as it may be used as a conductive layer and a plated layer to manufacture a laminate for an FPCB, and is exemplified by aluminum, gold, silver, etc., in addition to copper.

As described above, the present invention provides a method and an apparatus for manufacturing a laminate for an FPCB having a metal plated layer using vacuum deposition. According to the present invention, since a copper plated layer is formed through deposition in a vacuum chamber, a polyimide film on which a copper conductive layer is formed cannot be oxidized by external air or contaminated by dust present in external air.

In addition, a chemical, such as an aqueous copper sulfate solution, for use in formation of a copper plated layer in a conventional wet plating process is not used in the present invention, and thus, environmental contamination caused by such a chemical can be prevented, whereby environmentally friendly properties are exhibited.

In addition, the copper plated layer of the present invention has properties greatly affecting the reliability of the FPCB, such as number of pinholes, average particle size, adhesive strength and tensile strength, superior to a conventional plated layer. Therefore, a highly reliable FPCB can be manufactured.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A method for laminating material onto a flexible printed circuit board, the method comprising the steps of:
   treating a surface of a base film;
   forming a tie layer on the base film;
   forming a metal conductive layer on the tie layer, wherein the tie layer is formed between the base film and the metal conductive layer to increase an adhesive strength of the base film; and
   depositing a metal on the metal conductive layer by radiating electronic beams to form a metal plated layer thereon, wherein all of the steps are continuously conducted in a vacuum chamber.

2. The method as set forth in claim 1, wherein the forming of the metal conductive layer and the forming of the metal plated layer are performed using copper.

3. The method as set forth in claim 1, wherein the base film is a polyimide film.

4. The method as set forth in any one of claims 1 to 3, wherein the forming of the tie layer is performed by sputtering.

5. The method as set forth in any one of claims 1 to 3, wherein the forming of the metal conductive layers is performed bt sputtering.

* * * * *